United States Patent
Suzuki

(10) Patent No.: US 8,483,581 B2
(45) Date of Patent: Jul. 9, 2013

(54) LIGHT RECEIVING CIRCUIT AND SIGNAL PROCESSING METHOD

(75) Inventor: Yasuyuki Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 464 days.

(21) Appl. No.: 12/743,661

(22) PCT Filed: Nov. 26, 2008

(86) PCT No.: PCT/JP2008/071920
§ 371 (c)(1),
(2), (4) Date: May 19, 2010

(87) PCT Pub. No.: WO2009/069814
PCT Pub. Date: Jun. 4, 2009

(65) Prior Publication Data
US 2010/0284703 A1    Nov. 11, 2010

(30) Foreign Application Priority Data

Nov. 30, 2007 (JP) ................................. 2007-310737

(51) Int. Cl.
*H04B 10/06* (2006.01)
(52) U.S. Cl.
USPC ............................ 398/212; 398/209; 398/210
(58) Field of Classification Search
USPC ................................................. 398/202–214
See application file for complete search history.

(56) References Cited

U.S. PATENT DOCUMENTS

| | | | |
|---|---|---|---|
| 6,819,722 B2* | 11/2004 | Hatakeyama | 375/318 |
| 7,230,227 B2* | 6/2007 | Wilcken et al. | 250/214 A |
| 2007/0115051 A1* | 5/2007 | Sutardja | 330/100 |
| 2007/0230625 A1* | 10/2007 | Hironishi et al. | 375/329 |
| 2009/0034967 A1* | 2/2009 | Tao et al. | 398/33 |
| 2010/0172653 A1* | 7/2010 | Yonenaga et al. | 398/154 |

FOREIGN PATENT DOCUMENTS

| | | | |
|---|---|---|---|
| JP | 54-79609 A | 6/1979 |
| JP | 60-5693 A | 1/1985 |
| JP | 61-128617 A | 6/1986 |
| JP | 7-135487 A | 5/1995 |
| JP | 8-331064 A | 12/1996 |
| JP | 11-136104 A | 5/1999 |
| JP | 2003060580 A | 2/2003 |
| JP | 2004153313 A | 5/2004 |
| JP | 2006050146 A | 2/2006 |
| JP | 2006217605 A | 8/2006 |
| JP | 2006352401 A | 12/2006 |
| JP | 2007158600 A | 6/2007 |

OTHER PUBLICATIONS

International Search Report for PCT/JP2008/071920 mailed Jan. 29, 2009.

* cited by examiner

*Primary Examiner* — Dzung Tran

(57) ABSTRACT

A light receiving circuit includes: a 1-bit delay interferometer; two photodiodes; and a demodulating circuit for converting current signals of the photodiodes into voltages to thereby demodulate signals that have been modulated by return-to-zero differential phase shift keying, the demodulating circuit including a differential transimpedance amplifier, in which the differential transimpedance amplifier includes a level adjusting circuit that has a function of adjusting levels of a positive phase signal and a negative phase signal of two feedback closed loops.

13 Claims, 6 Drawing Sheets

LIGHT RECEIVING CIRCUIT AND SIGNAL PROCESSING METHOD

This application is the National Phase of PCT/JP2008/071920, filed Nov. 26, 2008, which claims priority from Japanese Unexamined Patent Application No. 2007-310737, filed on Nov. 30, 2007, the entire disclosure of which is incorporated herein by reference.

TECHNICAL FIELD

This invention relates to a light receiving circuit, and more particularly, to a light receiving circuit for receiving and demodulating an optical signal that has been subjected to return-to-zero (RZ) differential phase shift keying (DPSK) or return-to-zero (RZ) differential quadrature phase shift keying (DQPSK) as modulation coding.

BACKGROUND ART

In a long-distance optical transmission system, large-capacity information transmission is economically realized by applying the wavelength division multiplexing (WDM) transmission technology, in which optical signals with a plurality of wavelengths are transmitted white being multiplexed in one optical fiber. Regarding a WDM transmission device, an increase in transmission rate per wavelength is now being studied for reducing the device cost. At present, a transmission rate of 10 Gbit/s per wavelength is available for practical use, and further, transmission at 40 Gbit/s is now being studied.

A major challenge in increasing the transmission rate from 10 Gbit/s to 40 Gbit/s involves improving tolerance to optical noise (signal/noise (S/N) ratio). In long-distance transmission, a transmission distance is limited by optical noise that is generated in a transmission path and an optical amplifier used in an optical transceiver. Under the same modulation/demodulation scheme for use, tolerance to noise at the transmission rate of 40 Gbit/s is as low as one-fourth of that at the transmission rate of 10 Gbit/s. For that reason, a modulation/demodulation scheme with enhanced tolerance to optical noise is now being studied for the transmission at the transmission rate of 40 Gbit/s. Such a scheme is typified by a configuration in which RZ-DPSK modulation/demodulation is employed and a balanced receiver utilizing a delay interferometer is used on a receiver side.

FIG. 10 illustrates an example of a light receiving circuit for demodulating RZ-DPSK signals. In FIG. 10, a 1-bit delay interferometer 102 includes a 1-bit delay element in one of a pair of optical waveguides, and outputs a pair of two optical signals 103 and 103 corresponding to a phase difference between adjacent bits. Two photodiodes (PDs) 104 and 104 convert the two optical signals 103 and 103 output from the interferometer 102 into intensity-modulated signals, respectively. An anode and a cathode of the two PDs 104 and 104 are connected to each other so that a difference between the two signals may be output to thereby demodulate the RZ-DPSK signals. By means of a transimpedance amplifier 100-1 having negative feedback (feedback resistor 106), the demodulated output signal is converted from a current signal into a voltage signal, and then amplified.

Further, FIG. 11 illustrates another configuration for demodulating RZ-DPSK signals. In FIG. 11, two PDs 104 and 104 are directly connected to a differential amplifier included in a transimpedance amplifier 100-2, and the differential transimpedance amplifier 100-2 outputs differences between the signals to thereby demodulate the RZ-DPSK signals.

Patent Documents 1 to 3 are mentioned as Prior Patent Documents relating to an optical signal receiving circuit. Each of Patent Document 1 (Japanese Unexamined Patent Application Publication (JP-A) No. 2006-50146) and Patent Document 2 (Japanese Unexamined Patent Application Publication (JP-A) No. 2007-158600) discloses a light receiving circuit for an RZ-DPSK signal. Although having different configurations, those light receiving circuits are basically equivalent to the circuit illustrated in FIG. 10. Patent Document 3 (Japanese Unexamined Patent Application Publication (JP-A) No. 8-331064) discloses a light receiving circuit that adjusts an offset so that signals may cross each other at the middle point of the amplitude. The method of Patent Document 3 completely differs from a method of adjusting levels of negative feedback closed loops according to this invention. As described above, the technology of this invention is not disclosed in each of the light receiving circuits disclosed in Prior Patent Documents, and therefore this invention cannot easily be presumed from the above Prior Patent Documents.

DISCLOSURE OF THE INVENTION

In the light receiving circuits for RZ-DPSK modulation described above, the two signals need to accurately maintain a 1-bit phase difference therebetween and to have the same signal intensity until demodulated. In actuality, however, the two signals may not maintain their reception intensities or phases because of an intensity difference or an optical path difference between the two optical signals that is caused before the optical signals are input to the two PDs after having passed through the interferometer and lenses, as well as a difference in conversion efficiency of the PDs. The difference in reception intensity or in phase of those signals causes waveform distortion and an increase of the CMRR (common mode Rejection ratio), which leads to deterioration in reception performance. In addition, it is difficult to highly accurately control the optical path difference and light reception intensities.

FIG. 12A and FIG. 12B illustrate an example of signal waveforms obtained when there occurs an intensity difference between two signals before RZ-DPSK signal demodulation, and an example of signal waveforms obtained after the demodulation, respectively. FIG. 12A illustrates the waveforms of the two signals obtained before demodulation, and FIG. 12B illustrates the signal waveforms of positive and negative phases obtained after the demodulation. In this case, the demodulated signals have an amplitude of "1" (V1) and an amplitude of "0" (V0) satisfying V1>V0, resulting in different amplitude levels. Accordingly, there arise problems of deteriorated margin and reception sensitivity of the light receiving circuit.

This invention has been made to solve the problems described above, and provides a light receiving circuit and a signal processing method that are capable of correcting an optical path difference and a difference in light reception intensity.

A light receiving circuit according to one aspect of this invention includes: a 1-bit delay interferometer; two photodiodes; and a demodulating circuit for converting current signals of the photodiodes into voltages to thereby demodulate signals that have been modulated by return-to-zero differential phase shift keying, the demodulating circuit including a differential transimpedance amplifier, in which the differential transimpedance amplifier includes a level adjusting circuit that has a function of adjusting levels of a positive phase signal and a negative phase signal of two feedback closed loops.

A signal processing method according to another aspect of this invention includes: amplifying levels of an input positive phase signal and an input negative phase signal; adjusting signal amplitude levels of the amplified positive phase signal and the amplified negative phase signal: feeding the positive phase signal and the negative phase signal that have the adjusted signal amplitude levels back to inputs; and outputting the positive phase signal and the negative phase signal that have been demodulated.

According to this invention, a phase difference or a difference in light reception intensity in two signals that occurs before RZ-DPSK signal demodulation is corrected through the adjustment to the levels of the positive and negative phase signals of the two feedback closed loops in the transimpedance amplifier during the demodulation. The levels are adjusted to perform waveform correction, to thereby obtain a light receiving circuit and a signal processing method with improved reception performance.

BEST MODE FOR EMBODYING THE INVENTION

Figure 1:
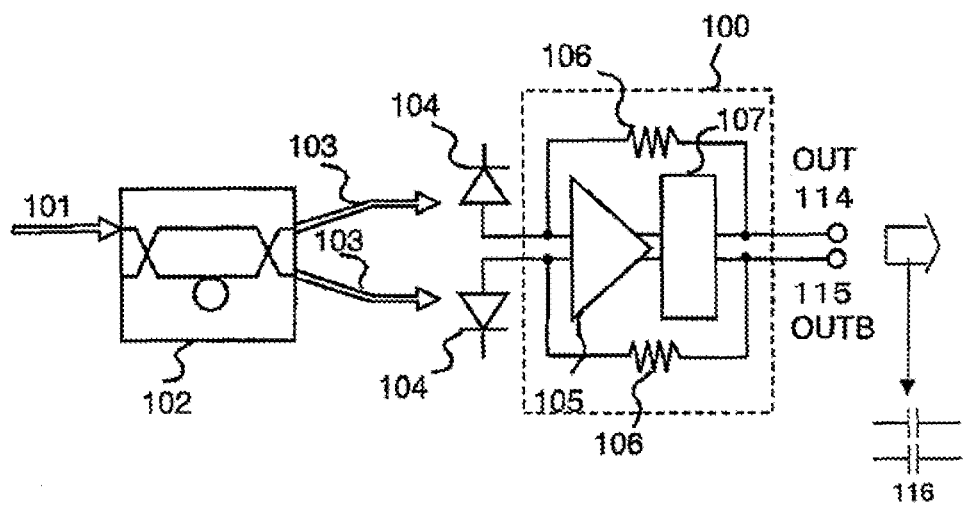
FIG. 1 is a block diagram of a light receiving circuit according to a first embodiment of this invention.

Now, referring to the drawings, embodiments of this invention are described in detail.

First Embodiment

Figure 2:
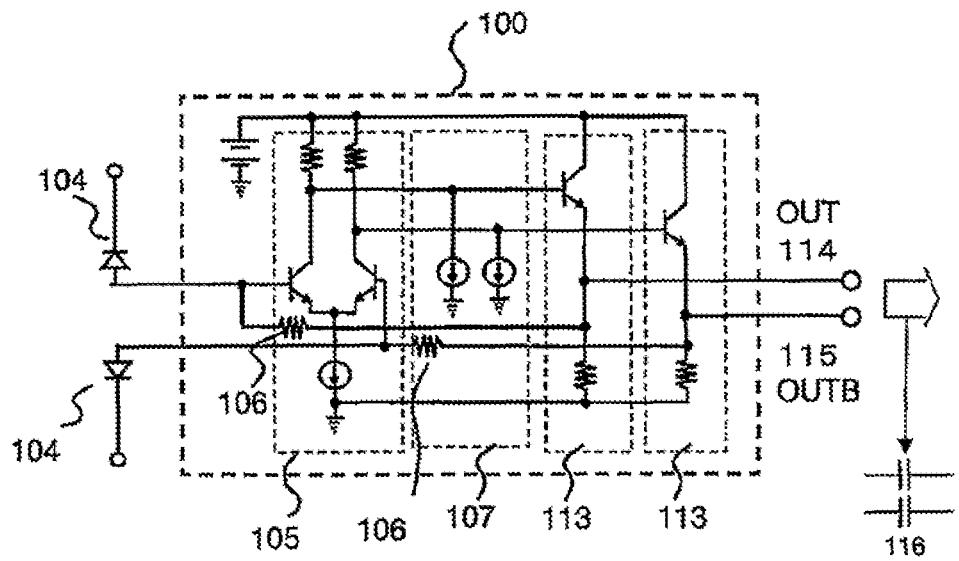
FIG. 2 is a circuit diagram illustrating a circuit configuration example of the light receiving circuit of FIG. 1.
Figure 3:
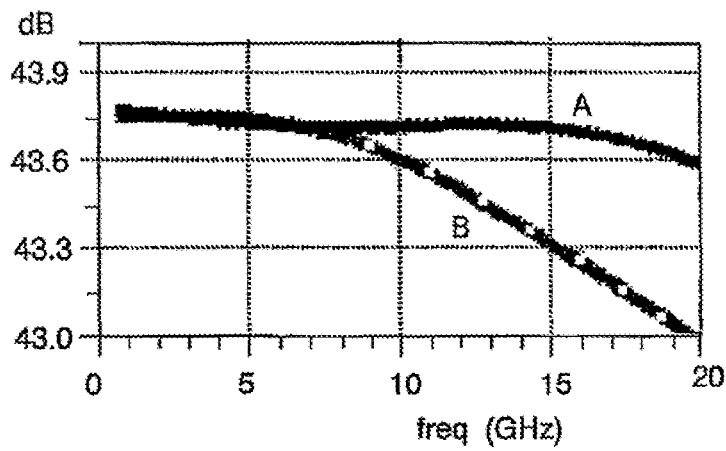
FIG. 3 is a graph illustrating gain dependence on frequency obtained when there occurs a difference between input DC levels of a differential amplifier used in the light receiving circuit of FIG. 1.
Figure 4A:
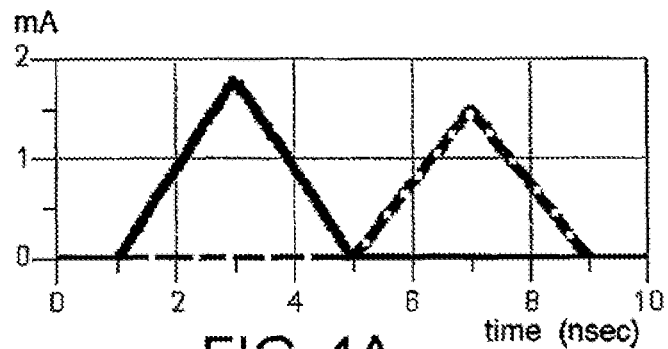
FIG. 4A is a waveform diagram illustrating an example of current signals from PDs of the light receiving circuit of FIG. 1.
Figure 4B:
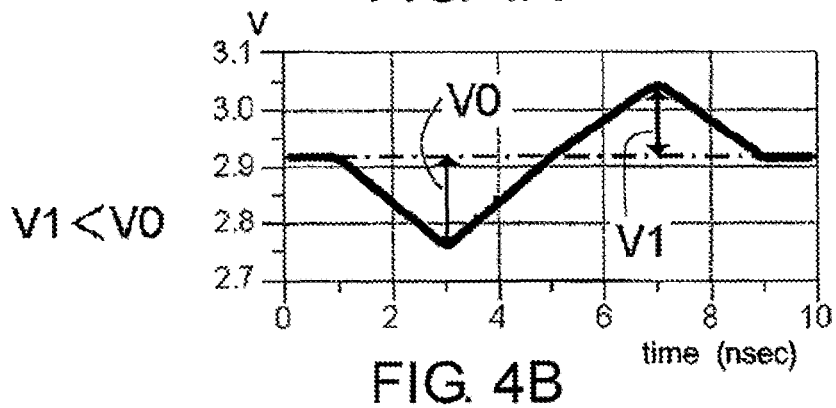
FIG. 4B is a waveform diagram illustrating an example of output signals of the light receiving circuit of FIG. 1, which are obtained through no adjustment to levels of feedback signals.
Figure 4C:
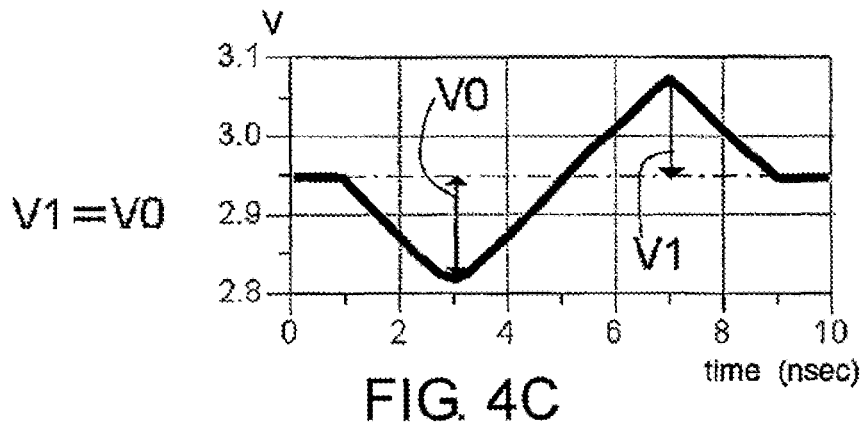
FIG. 4C is a waveform diagram illustrating an example of output signals of the light receiving circuit of FIG. 1, which are obtained through the adjustment to the levels of the feedback signals.

Referring to FIG. 1 to FIG. 4C, a first embodiment of this invention is described in detail. FIG. 1 is a block diagram of a light receiving circuit according to the first embodiment of this invention. FIG. 2 is a circuit diagram illustrating a circuit configuration example of the light receiving circuit. FIG. 3 illustrates gain dependence on frequency before and after RZ-DPSK demodulation, and FIGS. 4A to 4C illustrate signal waveforms before and after RZ-DPSK demodulation.

The light receiving circuit illustrated in FIG. 1 includes a 1-bit delay interferometer 102, two photodiodes (PDs) 104 and 104 for receiving two optical signals 103 and 103 corresponding to a phase difference between adjacent bits, respectively, and a differential transimpedance amplifier 100. The transimpedance amplifier 100 includes a differential amplifier 105 for inputting the two optical signals 103 and 103 from the two photodiodes (PDs) 104 and 104, a level adjusting circuit 107, and feedback resistors 106 and 106 for feeding outputs of the level adjusting circuit 107 back to the inputs of the differential amplifier 105. The level adjusting circuit 107 is a circuit for adjusting levels of positive and negative phase signals of negative feedback. The differential transimpedance amplifier 100 used herein is a demodulating circuit, which is a circuit for inputting modulated waveforms and outputting demodulated waveforms.

A set of RZ-DPSK-modulated optical signals 101 is input to the 1-bit delay interferometer 102. In the 1-bit delay interferometer 102, the two optical signals 103 and 103 corresponding to a phase difference between adjacent bits are output to be input to the two PDs 104 and 104, respectively. The two PDs 104 and 104 perform photoelectric conversion so that the input signals may be converted into intensity-modulated current signals. The converted current signals are converted into voltage signals in the differential transimpedance amplifier 100 having negative feedback. In the meantime, differences between the two input signals are output and demodulated so as to output two demodulated positive and negative phase RZ-DPSK signals (OUT 114 and OUTB 115). In this case, an intensity difference between the two signals before demodulation is adjusted by the level adjusting circuit 107, which is constituted within the differential transimpedance amplifier 100. The level adjusting circuit 107 adjusts the levels of the positive and negative phase signals of two feedback closed loops, to thereby output demodulated signals with adjusted levels.

Described next is a function with which the intensity difference between the two signals before demodulation may be corrected through the adjustment to the levels of the positive and negative phase signals of the two feedback closed loops in the differential transimpedance amplifier 100. FIG. 2 illustrates an example of the circuit constituting the differential transimpedance amplifier 100. The transimpedance amplifier 100 includes the differential amplifier 105 having differential inputs of the signals from the PDs 104 and 104, two emitter follower circuits 113 and 113 for receiving outputs of the differential amplifier as their respective inputs, the two feedback resistors 106 and 106 that are connected between respective outputs of the emitter follower circuits 113 and 113 and the inputs of the differential amplifier 105, and the level adjusting circuit 107 formed of two constant current sources that are connected to the outputs of the differential amplifier 105, respectively.

The two emitter follower circuits 113 and 113 output the outputs OUT 114 and OUTB 115 that have been demodulated as positive and negative phase signals, respectively. Transistors used in this case are formed of bipolar transistors, but may be formed of FETs, such as MOSes. For example, if FETs, such as MOSes, are employed therefor, the emitter follower circuits 113 may be constituted as source follower circuits.

The outputs of the differential amplifier 105 are connected to the inputs of the two emitter follower circuits 113 and 113, respectively, and the outputs of the emitter follower circuits 113 and 113 are fed back to input terminals of the differential amplifier 105. On this occasion, the constant current sources connected to the outputs of the differential amplifier 105 are adjusted to have, for example, different values so that the output levels of the emitter follower circuits 113 and 113 may be adjusted. The thus adjusted outputs of the emitter follower circuits 113 and 113 are fed back to the inputs of the differential amplifier 105 by means of the feedback resistors 106 and 106. Owing to the feedback closed loops formed in this way, the levels of the positive and negative phase signals may be adjusted.

The circuit 100 is a circuit whose outputs are negatively fed back to its inputs by means of the feedback resistors 106. In general, lines of the positive and negative phase signals of the two differential feedback closed loops are set to have the same voltage level, and hence the positive and negative phase outputs exhibit exactly the same gain and frequency characteristics. However, when such set levels are made different between the positive phase and the negative phase, the input levels thereof are changed to cause a change in frequency characteristics. FIG. 3 illustrates frequency characteristics obtained when there occurs a difference between input DC levels of the differential amplifier 105. In FIG. 3, for example, the line A and the line B show the frequency characteristics of the gains of the positive phase and the negative phase, respectively. As is apparent from FIG. 3, a gain difference occurs at high frequencies between the positive phase and the negative phase. The gain difference is caused due to bias dependence of high-frequency characteristics of initial-stage transistors because those transistors have different input biases. Accordingly, an amplification factor may be changed through the change in input level, and hence the intensity difference between the input signals may be corrected through the change in amplification factor in accordance with the intensity difference. This results from taking advantage of characteristics of RZ signals.

FIG. 4A illustrates waveforms of two current signals from the PDs 104 and 104, illustrating the case where the two signals has an intensity difference therebetween. FIG. 4B and FIG. 4C each illustrate demodulated waveforms (positive and negative phase signals) obtained in the differential transimpedance amplifier 100. For easy understanding, the case is shown here in which the two signals before demodulation are "0". Both the two signals cannot be "0" at a time in actuality, but will take a center level of "1" or "0" after demodulation. As illustrated in FIG. 4B where the positive and negative phase signals of negative feedback of the differential transimpedance amplifier 100 have the same set level, the signals of "1" and "0" obtained after demodulation have different amplitudes (V1<V0). However, as illustrated in FIG. 4C where the set levels thereof are changed, the center levels of "1" and "0" are changed so that the signals of "1" and "0" may have the same amplitude (V1=V0).

Accordingly, the magnitude of the waveforms obtained after demodulation may be corrected through the change in center levels in the differential amplifier 100 in accordance with the intensity difference between the input signals. This phenomenon results from taking advantage of characteristics of DPSK signals. Meanwhile, the positive and negative phase outputs of the transimpedance amplifier 100 have the same signal amplitude through the level adjustment made by the level adjusting circuit, but may have different DC levels as described below. In view of this, there may be employed such a configuration as illustrated in each of FIG. 1 and FIG. 2, in which capacitors 116 and 116, which block DC, are provided to the positive and negative phase outputs OUT 114 and OUTB 115 obtained after demodulation, respectively, and connection to the following stage is established by AC coupling.

As described above, in the differential transimpedance amplifier 100, the level adjusting circuit 107 adjusts the output levels of the emitter follower circuits 113 and 113, and the levels are fed back to the differential amplifier 105. Owing to the negative feedback closed loops formed in this way, the levels of the positive and negative phase signals may be adjusted. The intensity difference between the two signals before demodulation is corrected so that the signal amplitudes of "1" and "0" may have the same magnitude. The levels of the positive and negative phase signals are adjusted in this way so as to obtain the same signal amplitude, to thereby obtain a light receiving circuit with improved reception performance.

Second Embodiment

Figure 5:
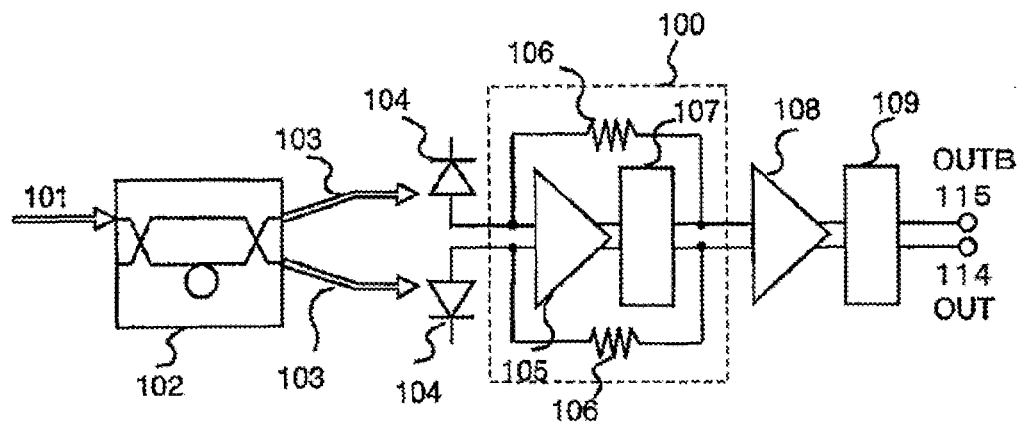
FIG. 5 is a block diagram of a light receiving circuit according to a second embodiment of this invention.

Referring to FIG. 5 and FIG. 6A to FIG. 6D, a second embodiment of this invention is described. FIG. 5 illustrates a block diagram of a light receiving circuit for RZ-DPSK signals according to the second embodiment of this invention. FIG. 6A to FIG. 6D illustrate signal waveforms obtained before and after adjustment to DC levels, illustrating effects produced by the light receiving circuit of this invention. The light receiving circuit of this embodiment is realized by adding, at a subsequent stage of the light receiving circuit according to the first embodiment, a main amplifier 108 and a DC level correcting circuit 109 for correcting a DC level difference.

To be described in detail, the light receiving circuit of FIG. 5 includes the 1-bit delay interferometer 102, the two photodiodes (PDs) 104 and 104, the differential transimpedance amplifier 100, the main amplifier 108, and the DC level correcting circuit 109. The 1-bit delay interferometer 102 inputs the optical signals 101, and outputs the two optical signals 103 and 103 corresponding to a phase difference between adjacent bits. The two photodiodes (PDs) 104 and 104 receive those optical signals 103 and 103 and convert the received optical signals into current signals.

The transimpedance amplifier 100 includes the differential amplifier 105 for inputting the signals from the two photodiodes (PDs) 104 and 104, the level adjusting circuit 107, and the feedback resistors 106 and 106 for feeding outputs of the level adjusting circuit 107 back to the inputs of the differential amplifier 105. The level adjusting circuit 107 adjusts the levels of the positive and negative phase signals of the two feedback closed loops. The transimpedance amplifier 100 is further provided with the main amplifier 108 and the DC level correcting circuit 109 at the subsequent stage. The main amplifier 108 amplifies the demodulated positive and negative phase signals from the transimpedance amplifier 100, while the DC level correcting circuit 109 corrects a DC level difference between those positive and negative phase signals.

The set of RZ-DPSK-modulated optical signals 101 is input to the 1-bit delay interferometer 102. In the 1-bit delay interferometer 102, the two optical signals 103 and 103 corresponding to a phase difference between adjacent bits are output to be input to the two PDs 104 and 104, respectively. The two PDs 104 and 104 perform photoelectric conversion so that the two optical signals 103 and 103 may be converted into intensity-modulated current signals. The converted current signals are converted into voltage signals in the differential transimpedance amplifier 100 having negative feedback. In the meantime, differences between the two input signals are output and demodulated so as to obtain two demodulated RZ-DPSK signals of the positive phase and the negative phase. In this case, regarding an intensity difference between the two signals before demodulation, the levels of the positive and negative phase signals of the two feedback closed loops are adjusted by the level adjusting circuit 107, to thereby output the positive and negative phase signals with the corrected intensity difference.

The outputs of the differential transimpedance amplifier 100 are amplified by the main amplifier 108. Because it is the level adjusting circuit 107 that adjusts the outputs of the differential transimpedance amplifier 100, the positive and negative phase signals may have different DC center levels of demodulated signals. For that reason, the DC level correcting circuit 109 corrects the DC levels of the positive and negative phase waveforms of the demodulated signals.

Figure 6A:
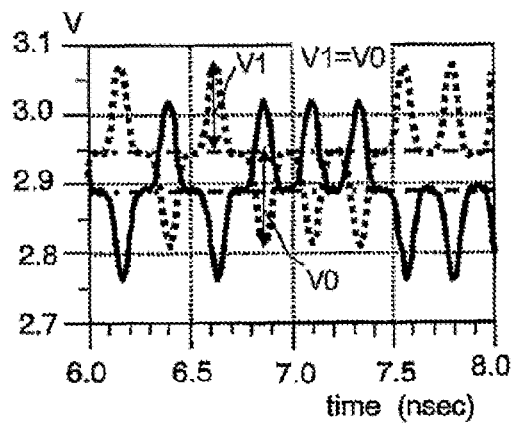
FIG. 6A is a waveform diagram of positive and negative phase output signals of a differential transimpedance amplifier used in the light receiving circuit of FIG. 5.
Figure 6C:
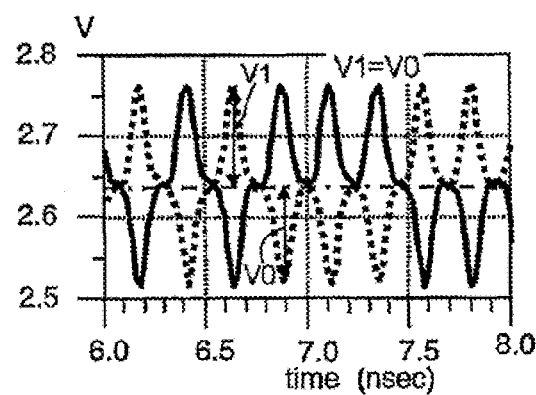
FIG. 6C is a waveform diagram of positive and negative phase output signals of the light receiving circuit (DC level correcting circuit) of FIG. 5.
Figure 6B:
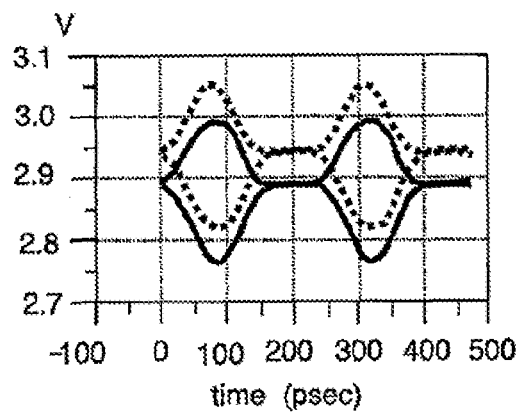
FIG. 6B is a graph illustrating respective eye patterns of the positive and negative phase output signals of the differential transimpedance amplifier used in the light receiving circuit of FIG. 5.
Figure 6D:
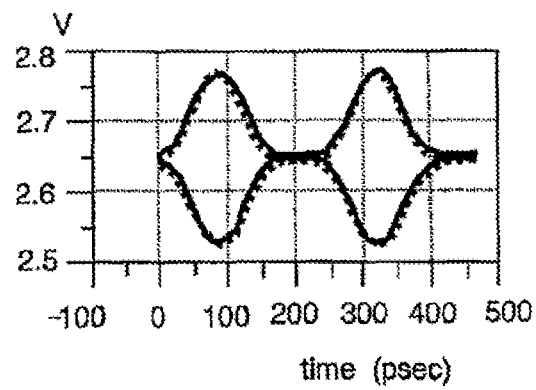
FIG. 6D is a graph illustrating respective eye patterns of the positive and negative phase output signals of the light receiving circuit (DC level correcting circuit) of FIG. 5.

FIG. 6A and FIG. 6B illustrate output waveforms and output eye waveforms of the positive phase and the negative phase obtained in the differential transimpedance amplifier 100, respectively. FIG. 6C and FIG. 6D illustrate output waveforms and output eye waveforms obtained after the DC levels are corrected by the DC level correcting circuit 109, respectively. In FIGS. 6A to 6D, one of the positive phase and the negative phase is illustrated as the solid line while the other thereof is illustrated as the broken line. As illustrated in FIG. 6A and FIG. 6B where the demodulated signals have an intensity difference between the two signals adjusted by the level adjusting circuit 107, the positive and negative phase signals have the same amplitude of "1" and "0", but have different DC levels. However, as illustrated in FIG. 6C and FIG. 6D where the DC levels are further corrected by the DC level correcting circuit 109 so as to obtain the same DC level, the positive and negative phase signal waveforms having exactly the same amplitude and exactly the same center level are obtained.

Comparison is made between FIG. 6B and FIG. 6D illustrating the output eye waveforms. The output eye waveforms illustrated in FIG. 6B have the levels that are adjusted so as to obtain the same amplitude (level) of "1" and "0" between the positive phase and the negative phase. However, the DC levels as the center levels of "1" and "0" differ between the positive phase and the negative phase, resulting in the output eye waveforms with the deviated DC levels. On the other hand, the output eye waveforms illustrated in FIG. 6D have the levels and the DC levels that are adjusted so as to obtain both the same amplitude (level) and DC level of "1" and "0" between the positive phase and the negative phase. Accordingly, the output eye waveforms of the positive phase and the negative phase are output as being superimposed on each other to be observed as the same waveform.

As described above, the levels of the positive and negative phase signals of the two feedback closed loops in the differential transimpedance amplifier 100 are adjusted by the level adjusting circuit 107. The intensity difference between the two signals before demodulation is corrected so that the signal amplitudes of the positive and negative phase signals may have the same signal magnitude after demodulation. Further, the level correcting circuit 109 corrects the DC level difference that occurs after the demodulation. In this way, the positive and negative phase signal waveforms after the demodulation may be made the same (symmetrical). Because the positive and negative phase signal waveforms after the demodulation are made the same, there may be obtained a light receiving circuit with improved reception performance.

Third Embodiment

Figure 7:
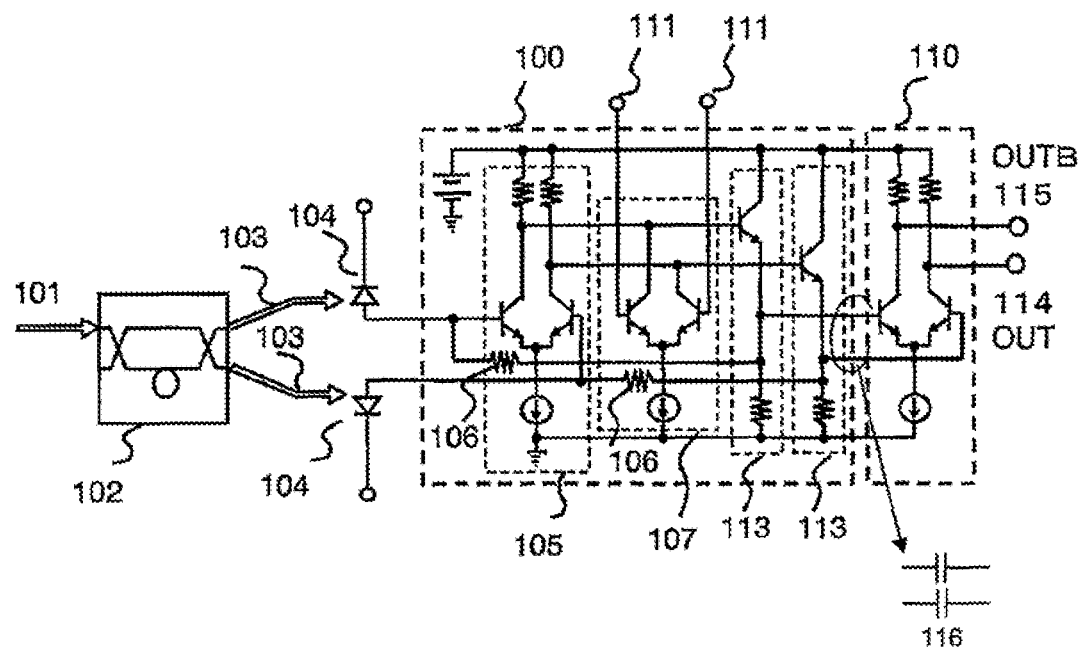
FIG. 7 is a circuit diagram of a light receiving circuit according to a third embodiment of this invention.

Referring to FIG. 7, a third embodiment of this invention is described. FIG. 7 illustrates a circuit diagram of a light receiving circuit for RZ-DPSK signals according to the third embodiment. The light receiving circuit of this embodiment is another example of a circuit configuration of a light receiving circuit having the same function as in the light receiving circuit according to the first embodiment.

The light receiving circuit of FIG. 7 includes the 1-bit delay interferometer 102, the two photodiodes (PDs) 104 and 104 for receiving the two optical signals 103 and 103 corresponding to a phase difference between adjacent bits, the differential transimpedance amplifier 100, and an output amplifier 110. The differential transimpedance amplifier 100 includes the differential amplifier 105 having inputs connected to the two PDs 104 and 104, the two emitter follower circuits 113 and 113 formed of transistors, which are connected to the positive and negative phase outputs of the differential amplifier 105, and resistors, and the two feedback resistors 106 and 106 connected from respective emitter terminals of the transistors to the inputs of the differential amplifier 105. The level adjusting circuit 107 for adjusting levels of the positive and negative phase signals of the two feedback closed loops is formed of a differential circuit. The differential circuit has two outputs connected between the outputs of the differential amplifier 105 and the inputs of the two emitter follower circuits 113.

The differential circuit constituting the level adjusting circuit 107 has differential transistors whose inputs are provided with input terminals 111 and 111, respectively, and respective currents flowing through the differential transistors are controlled to thereby control output levels thereof. The level adjusting circuit 107 controls the output (collector) levels of the differential transistors to thereby adjust the levels of the positive and negative phase signals of the two feedback closed loops. If two signals before demodulation have no intensity difference therebetween, the input terminals 111 and 111 of the differential circuit are applied with the same potential so that the levels of the differential transistors may be made the same. As a result, the positive and negative phase signals of the two feedback closed loops have the same level, and are demodulated and amplified as they are.

If there occurs an intensity difference between two signals before demodulation, the input terminals 111 and 111 of the differential circuit are applied with different potentials so that the differential transistors may have different output levels. The levels of the differential transistors of the level adjusting circuit 107 are adjusted to differ from each other, to thereby adjust the levels of the positive and negative phase signals of the two feedback closed loops. As a result, waveforms after demodulation are output with the influence of the intensity difference between the two signals corrected. The outputs from the transimpedance amplifier 100 are amplified by the output amplifier 110 and then output as the outputs OUT 114 and OUTB 115.

According to this embodiment, the external level adjustment to the positive and negative phase signals of the two feedback closed loops is performed using the input terminals 111 and 111. Alternatively, the adjustment to one of the positive and negative phase signals may be made within the circuit by means of, for example, a resistor, while another thereof may be made externally. Further, the transistors are formed of bipolar transistors, but may be formed of FETs, such as MOSes. Still further, instead of the DC connection, AC connection may be made for the connection between the transimpedance amplifier 100 and the output amplifier 110. For example, such a configuration as indicated by the leader line (arrow) of FIG. 7 may be employed, in which the capacitors 116 and 116, which block DC, are provided to the positive and negative phase outputs obtained after demodulation, respectively, so as to establish the connection to the following-stage output amplifier by AC coupling.

As described above, in the differential transimpedance amplifier 100, the inputs of the differential transistors of the level adjusting circuit are externally controlled to adjust the output levels thereof. The level adjusting circuit 107 adjusts the output levels of the emitter follower circuits 113 and 113, and the levels are fed back to the differential amplifier 105. Owing to the negative feedback closed loops formed in this way, the levels of the positive and negative phase signals may be adjusted. The intensity difference between the two signals before demodulation is corrected so that the signal amplitudes of "1" and "0" may have the same magnitude after the demodulation. The levels of the positive and negative phase signals are adjusted in this way so as to obtain the same signal amplitude, to thereby obtain a light receiving circuit with improved reception performance.

Fourth Embodiment

Figure 8:
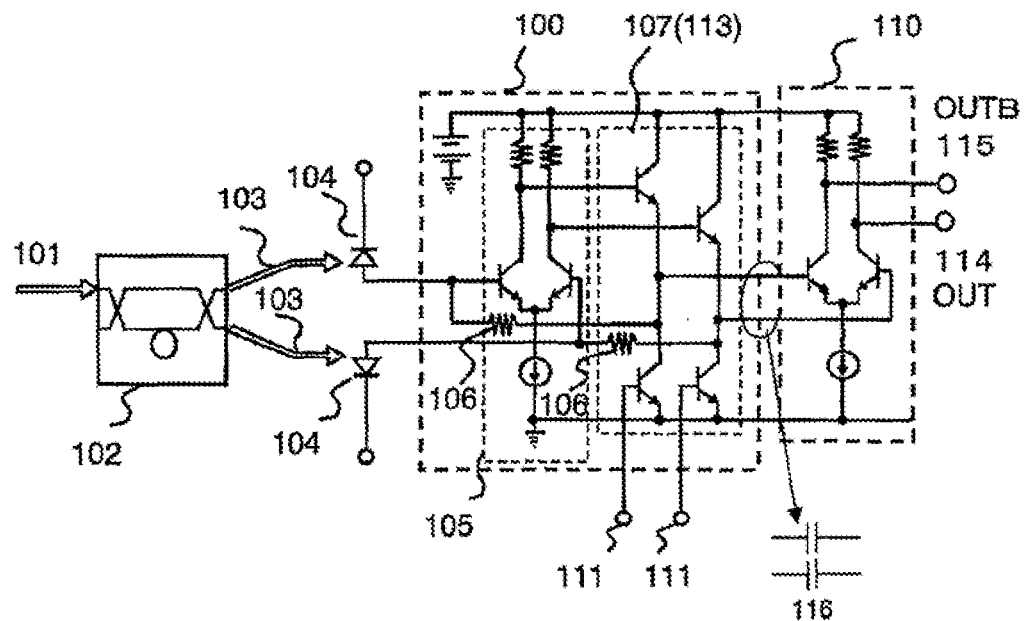
FIG. 8 is a circuit diagram of a light receiving circuit according to a fourth embodiment of this invention.

Referring to FIG. 8, a fourth embodiment of this invention is described. FIG. 8 illustrates a circuit diagram of a light receiving circuit for RZ-DPSK signals according to the fourth embodiment. The light receiving circuit of this embodiment is further another example of the circuit configuration of the light receiving circuit having the same function as in the light receiving circuit according to the first embodiment. This embodiment employs a circuit configuration in which the level adjusting circuit 107 and the emitter follower circuits 113 and 113 are integrated. In the following description, the level adjusting circuit 107 and the emitter follower circuits 113 and 113 are collectively referred to as the level adjusting circuit 107.

The light receiving circuit of FIG. 8 includes the 1-bit delay interferometer 102, the two photodiodes (PDs) 104 and 104 for receiving the two optical signals 103 and 103 corresponding to a phase difference between adjacent bits, the differential transimpedance amplifier 100, and the output amplifier 110. The differential transimpedance amplifier 100 includes the differential amplifier 105 having inputs connected to the two PDs 104 and 104, the level adjusting circuit 107 formed of emitter follower circuits, and the two feedback resistors 106 and 106 connected between respective outputs of the emitter follower circuits and the inputs of the differential amplifier 105.

In the level adjusting circuit 107, two transistors are cascaded between power sources, for receiving inputs of the output from the differential amplifier 105 and a potential from the external level adjusting terminal 111 or 111, respectively. In the circuit 107, the transistors for receiving the inputs of the potentials from the external level adjusting terminals 111 and 111 serve as variable resistors to constitute emitter follower circuits. Based on the input potentials from the level adjusting terminals 111 and 111, respective currents flowing through the transistors are controlled to thereby control the levels of the positive and negative phase signals of the two feedback closed loops. The output amplifier 110 connected at the subsequent stage of the differential transimpedance amplifier 100 outputs the corrected outputs OUT 114 and OUTB 115.

The level adjustment to the positive and negative phase signals of the two feedback closed loops may be made through the adjustment to the currents flowing through the emitter follower circuits based on the potentials from the level adjusting terminals 111 and 111. If two signals before demodulation have no intensity difference therebetween, the level adjusting terminals for the transistors constituting the emitter follower circuits are applied with the same input potential. In this case, the two positive and negative phase signals of negative feedback have the same level, and are demodulated and amplified as they are. If there occurs an intensity difference between two signals before demodulation, the level adjusting terminals 111 and 111 for the transistors constituting the emitter follower circuits are applied with different input potentials. Through the adjustment to the currents flowing through the emitter follower circuits, the levels of the two positive and negative phase signals of negative feedback may be adjusted. Waveforms after demodulation are output with the influence of the intensity difference between the two signals corrected.

According to this embodiment, the level adjustment to the positive and negative phase signals of the two feedback closed loops is performed through the external inputs from the input terminals for the transistors of the emitter follower circuits. However, the way of performing the adjustment is not limited thereto, and, for example, a current mirror circuit may be constituted. Alternatively, the adjustment to one of the positive and negative phase signals may be made within the circuit by means of, for example, a resistor, while another thereof may be made through an external input. Further, the transistors are formed of bipolar transistors, but may be formed of FETs, such as MOSes. Still further, instead of the DC connection, AC connection may be made for the connection between the transimpedance amplifier 100 and the output amplifier 110. For example, such a configuration as indicated by the reader line (arrow) of FIG. 8 may be employed, in which the capacitors 116, which block DC, are provided to the positive and negative phase outputs obtained after demodulation, respectively, so as to establish the connection to the following-stage output amplifier by AC coupling.

As described above, in the differential transimpedance amplifier 100, the currents flowing through the emitter follower circuits of the level adjusting circuit 107 are controlled. The level adjusting circuit 107 adjusts the output levels of the emitter follower circuits, and the levels are fed back to the differential amplifier 105. Owing to the negative feedback closed loops formed in this way, the levels of the positive and negative phase signals may be adjusted. The intensity difference between the two signals before demodulation is corrected so that the signal amplitudes of "1" and "0" may have the same magnitude after the demodulation. The levels of the positive and negative phase signals are adjusted in this way so as to obtain the same signal amplitude, to thereby obtain a light receiving circuit with improved reception performance.

Fifth Embodiment

Figure 9:
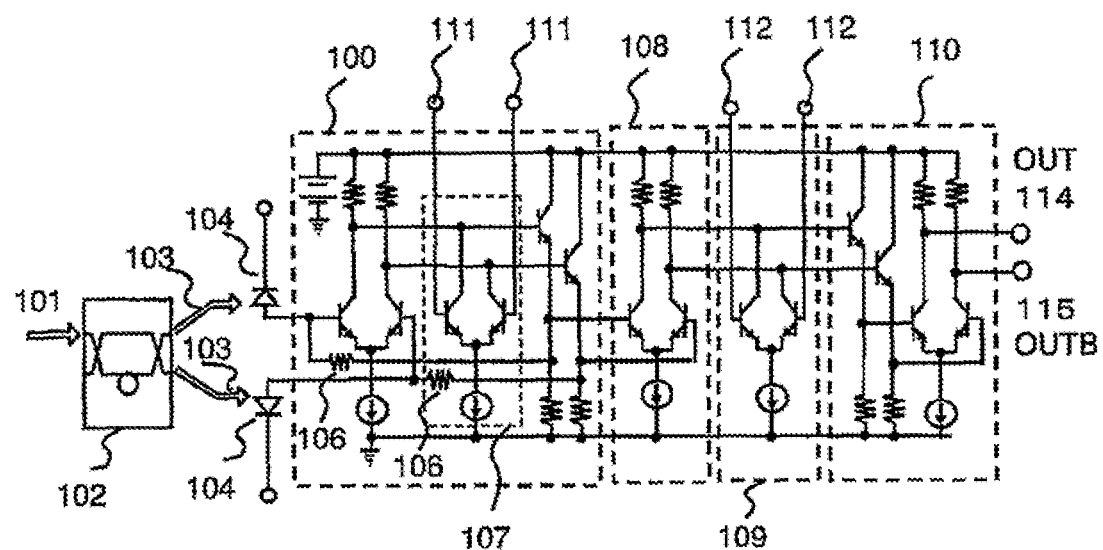
FIG. 9 is a circuit diagram of a light receiving circuit according to a fifth embodiment of this invention.
Figure 10:
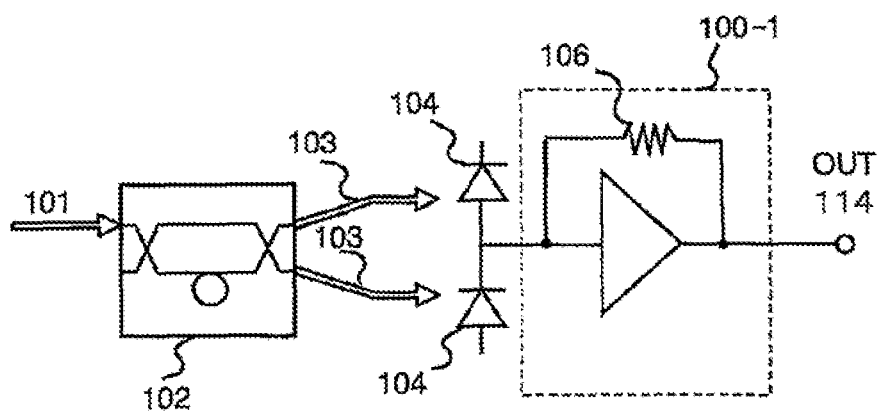
FIG. 10 is a circuit diagram illustrating a first conventional light receiving circuit.
Figure 11:
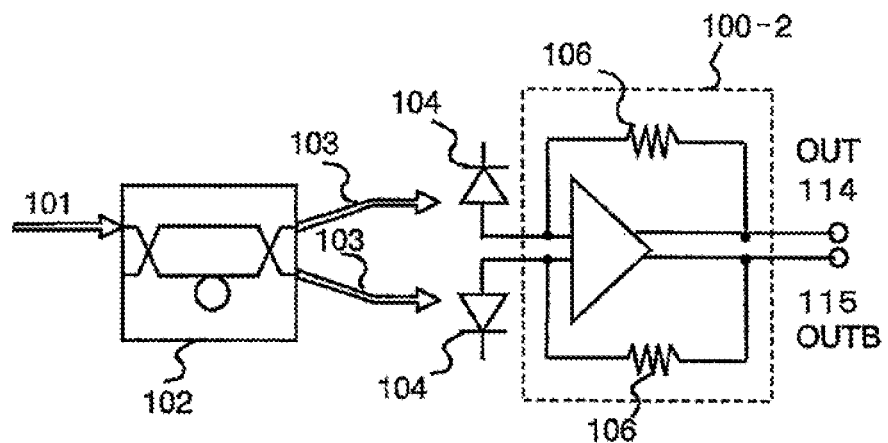
FIG. 11 is a circuit diagram illustrating a second conventional light receiving circuit.
Figure 12A:
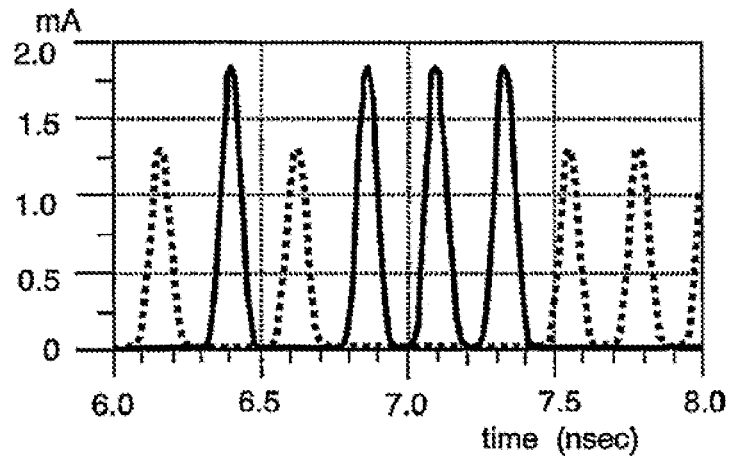
FIG. 12A is a graph illustrating an example of signal waveforms obtained when there occurs an intensity difference between two signals before RZ-DPSK signal demodulation in a conventional light receiving circuit.
Figure 12B:
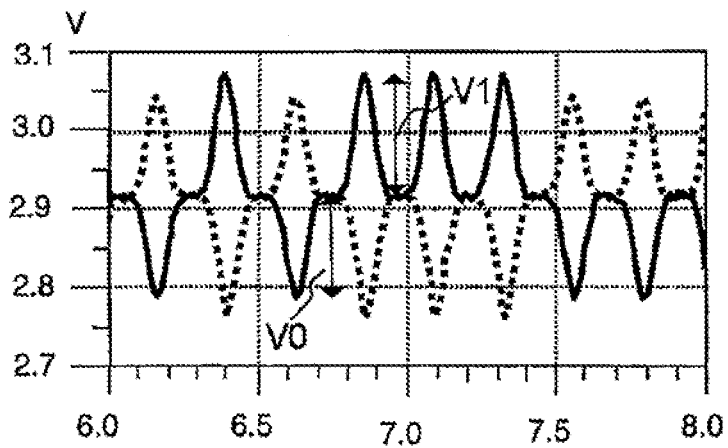
FIG. 12B is a graph illustrating signal waveforms obtained after the demodulation of the two signals having the signal waveforms of FIG. 12A.

Referring to FIG. 9, a fifth embodiment of this invention is described. FIG. 9 illustrates a circuit diagram of a light receiving circuit for RZ-DPSK signals according to the fifth embodiment. The light receiving circuit of this embodiment is an example of a circuit configuration of the light receiving circuit according to the second embodiment.

The light receiving circuit of FIG. 9 includes the 1-bit delay interferometer 102, the two photodiodes (PDs) 104 and 104 for receiving the two optical signals 103 and 103 corresponding to a phase difference between adjacent bits, the differential transimpedance amplifier 100, the main amplifier 108, the DC level correcting circuit 109, and the output amplifier 110.

The differential transimpedance amplifier 100 includes a differential amplifier (105) having inputs connected to the two PDs 104 and 104, the level adjusting circuit 107, two emitter followers (113 and 113) formed of transistors, which are connected to the positive and negative phase outputs from the differential amplifier, and resistors, and the two feedback resistors 106 and 106 connected between respective outputs of the emitter followers and the inputs of the differential amplifier. The level adjusting circuit 107 is formed of a differential circuit provided with the level adjusting terminals 111 and 111, and adjusts the levels of the positive and negative phase signals of the two feedback closed loops. The differential circuit constituting the level adjusting circuit 107 has outputs connected to respective connection lines between outputs of the differential amplifier included in the differential transimpedance amplifier 100 and inputs of the two emitter follower circuits. This transimpedance amplifier 100 has the same configuration as in the transimpedance amplifier 100 of the third embodiment.

The main amplifier 108 is formed of a differential amplifier, and inputs demodulated signals from the transimpedance amplifier 100 and outputs the signals to the DC level correcting circuit 109 and the output amplifier 110. The DC level correcting circuit 109 has a differential circuit configuration provided with DC level correcting terminals 112 and 112. The DC level correcting circuit 109 has outputs connected to respective connection lines between the positive and negative phase signal outputs of the main amplifier 108 and inputs of the output amplifier 110, so as to correct a DC level difference. The output amplifier 110 is formed of emitter follower circuits for receiving the outputs from the main amplifier 108 as their inputs, and a differential amplifier for receiving outputs of the emitter follower circuits as its inputs, so as to output the outputs OUT 114 and OUTB 115.

The set of RZ-DPSK-modulated optical signals 101 is input to the 1-bit delay interferometer 102. In the 1-bit delay interferometer 102, the two optical signals 103 and 103 corresponding to a phase difference between adjacent bits are output to be input to the two PDs 104 and 104, respectively. The two PDs 104 and 104 perform photoelectric conversion so that the two optical signals may be converted into intensity-modulated current signals. The converted current signals are converted into voltage signals in the differential transimpedance amplifier 100 having negative feedback. In the meantime, differences between the two input signals are output and demodulated simultaneously so as to obtain demodulated RZ-DPSK signals of the positive phase and the negative phase.

In this case, an intensity difference between the two signals before demodulation is adjusted by the level adjusting circuit 107, which is constituted within the differential transimpedance amplifier 100. The levels of the positive and negative phase signals of the two feedback closed loops are adjusted so that the signals may be output with a corrected intensity difference therebetween. The outputs of the differential transimpedance amplifier 100 are amplified by the main amplifier 108. However, because it is the level adjusting circuit 107 that adjusts the levels, the outputs of the differential transimpedance amplifier 100 may have different center levels between the positive and negative phase demodulated signals. For that reason, the DC level correcting circuit 109 corrects the DC levels of the positive and negative phase waveforms of the demodulated signals.

As in the second embodiment (as described with reference to FIG. 6A to FIG. 6D), even if the demodulated positive and negative phase signals have different DC levels due to the level adjusting circuit 107, the DC levels are corrected by the DC level correcting circuit 109, to thereby obtain exactly the same corrected signal waveforms (symmetrical signal waveforms).

According to this embodiment, the level adjustment to the positive and negative phase signals of the two feedback closed loops and the DC level correction to the positive and negative phase signals of the main amplifier are performed externally. Alternatively, the adjustment or the correction to one of the positive and negative phase signals may be made within the circuit by means of, for example, a resistor, while the other thereof may be made externally. Further, the transistors are formed of bipolar transistors, but may be formed of FETs, such as MOSes.

As described above, the levels of the positive and negative phase signals of the two feedback closed loops in the differential transimpedance amplifier 100 are adjusted by the level adjusting circuit 107. The intensity difference between the two signals before demodulation is corrected so that the signal amplitudes of the positive and negative phase signals may have the same magnitude. Further, the level correcting circuit 109 corrects the DC level difference that occurs after the demodulation, to thereby make the same (symmetrical) the positive and negative signal waveforms. Because the positive and negative phase signal waveforms are made the same, there may be obtained a light receiving circuit with improved reception performance.

The features of the light receiving circuit according to this invention are described below. The light receiving circuit according to this invention includes: a 1-bit delay interferometer; two photodiodes; and a demodulating circuit for converting current signals of the photodiodes into voltages to thereby demodulate signals that have been modulated by return-to-zero differential phase shift keying, the demodulating circuit including a differential transimpedance amplifier, in which the differential transimpedance amplifier includes a level adjusting circuit that has a function of adjusting levels of a positive phase signal and a negative phase signal of two feedback closed loops. Further, at a subsequent stage of the differential transimpedance amplifier, there may be further provided a DC level correcting circuit that has a function of correcting a DC level difference between the positive phase signal and the negative phase signal that have been demodulated, the DC level difference being caused by the differential transimpedance amplifier.

Still further, in the light receiving circuit according to this invention: the differential transimpedance amplifier may include: a differential amplifier having two inputs that are connected to the two photodiodes, respectively; two emitter follower circuits or two source follower circuits that are connected to two outputs of the differential amplifier, respectively; two feedback resistors that are connected between outputs of the emitter follower circuits or the source follower circuits, and the inputs of the differential amplifier, respectively; and the level adjusting circuit; the level adjusting circuit may include a differential circuit; the differential circuit may have two outputs connected to respective connection lines between the outputs of the differential amplifier and inputs of the emitter follower circuits or the source follower circuits; and the levels of the positive phase signal and the negative phase signal of the two feedback closed loops may be adjusted through adjustment to input voltages of differential transistors of the differential circuit.

Still further, in the light receiving circuit according to this invention: the differential transimpedance amplifier may include: a differential amplifier having two inputs that are connected to the two photodiodes, respectively; the level adjusting circuit; and two feedback resistors that are connected to outputs of the level adjusting circuit and the inputs of the differential amplifier, respectively; the level adjusting circuit may include two emitter follower circuits or two source follower circuits that are connected to outputs of the differential amplifier, respectively; and the levels of the positive phase signal and the negative phase signal of the two feedback closed loops may be adjusted through adjustment to currents flowing through the emitter follower circuits or the source follower circuits.

Still further, in the light receiving circuit according to this invention: the differential transimpedance amplifier may include: a differential amplifier having two inputs that are connected to the two photodiodes, respectively; two emitter follower circuits or two source follower circuits that are connected to two outputs of the differential amplifier, respectively; two feedback resistors that are connected between outputs of the emitter follower circuits or the source follower circuits, and the inputs of the differential amplifier, respectively; and the level adjusting circuit; the level adjusting circuit may include a first differential circuit; the first differential circuit may have two outputs that are connected to respective connection lines between the outputs of the differential amplifier and inputs of the emitter follower circuits or the source follower circuits; the levels of the positive phase signal and the negative phase signal of the two feedback closed loops may be adjusted through adjustment to input voltages of differential transistors of the differential circuit; the DC level correcting circuit, which is provided at the subsequent stage of the differential transimpedance amplifier, may include a second differential circuit; and the DC level difference between the positive phase signal and the negative phase signal that have been demodulated may be corrected through adjustment to input voltages of differential transistors of the second differential circuit.

Still further, in the light receiving circuit according to this invention: the differential transimpedance amplifier may include: a differential amplifier having two inputs that are connected to the two photodiodes, respectively; the level adjusting circuit; and two feedback resistors that are connected to outputs of the level adjusting circuit and the inputs of the differential amplifier, respectively; the level adjusting circuit may include two emitter follower circuits or two source follower circuits that are connected to two outputs of the differential amplifier, respectively; the levels of the positive phase signal and the negative phase signal of the two feedback closed loops may be adjusted through adjustment to currents flowing through the emitter follower circuits or the source follower circuits; the DC level correcting circuit, which is provided at the subsequent stage of the differential transimpedance amplifier, may include a differential circuit; and the DC level difference between the positive phase signal and the negative phase signal that have been demodulated may be corrected through adjustment to input voltages of differential transistors of the differential circuit.

Still further, the light receiving circuit according to this invention may further include capacitors so as to establish connection to the subsequent stage by AC coupling in a case where the outputs having the levels adjusted by the level adjusting circuit are connected to the subsequent stage without correcting the DC levels by the DC level correcting circuit.

The signal processing method according to this invention includes: amplifying levels of an input positive phase signal and an input negative phase signal: adjusting signal amplitude levels of the amplified positive phase signal and the amplified negative phase signal; feeding the positive phase signal and the negative phase signal that have the adjusted signal amplitude levels back to inputs; and outputting the positive phase signal and the negative phase signal that have been demodulated. The signal processing method may further include: correcting DC levels of the demodulated positive phase signal and the demodulated negative phase signal; and outputting the demodulated positive phase signal and the demodulated negative phase signal that have the corrected DC levels.

The light receiving circuit according to this invention may include: a pair of photodiodes; a differential amplifier having two inputs that are connected to the photodiodes; a level adjusting circuit for adjusting levels of two output signals from the differential amplifier; and two feedback resistors for feeding the signals that have the adjusted levels back to the differential amplifier. Further, this light receiving circuit may further include a DC level correcting circuit for correcting DC levels of the signals that have the adjusted levels.

This invention has been specifically described above by way of some embodiments, but is not limited to the above-mentioned embodiments. Various modifications may be made without departing the gist of this application, and modification examples thereof shall be encompassed in this application.

The invention claimed is:

1. A light receiving circuit, comprising:
   a 1-bit delay interferometer;
   two photodiodes; and
   a demodulating circuit for converting current signals of the photodiodes into voltages to thereby demodulate signals that have been modulated by return-to-zero differential phase shift keying,
      the demodulating circuit comprising a differential transimpedance amplifier,
   wherein the differential transimpedance amplifier comprises a level adjusting circuit that has a function of adjusting levels of a positive phase signal and a negative phase signal of two feedback closed loops so that the positive phase signal and the negative phase signal are equal to each other in amplitude.

2. A light receiving circuit according to claim 1, further comprising, at a subsequent stage of the differential transimpedance amplifier, a DC level correcting circuit that has a function of correcting a DC level difference between the positive phase signal and the negative phase signal that have been demodulated, the DC level difference being caused by the differential transimpedance amplifier.

3. A light receiving circuit according to claim 2,
wherein the differential transimpedance amplifier comprises:
  a differential amplifier having two inputs that are connected to the two photodiodes, respectively;
  two emitter follower circuits or two source follower circuits that are connected to two outputs of the differential amplifier, respectively;
  two feedback resistors that are connected between outputs of the emitter follower circuits or the source follower circuits, and the inputs of the differential amplifier, respectively; and
  the level adjusting circuit,
wherein the level adjusting circuit comprises a first differential circuit,
  wherein the first differential circuit has two outputs that are connected to respective connection lines between the outputs of the differential amplifier and inputs of the emitter follower circuits or the source follower circuits,
  wherein the levels of the positive phase signal and the negative phase signal of the two feedback closed loops are adjusted through adjustment to input voltages of differential transistors of the first differential circuit,
  wherein the DC level correcting circuit, which is provided at the subsequent stage of the differential transimpedance amplifier, comprises a second differential circuit, and
  wherein the DC level difference between the positive phase signal and the negative phase signal that have been demodulated is corrected through adjustment to input voltages of differential transistors of the second differential circuit.

4. A light receiving circuit according to claim 2,
wherein the differential transimpedance amplifier comprises:
  a differential amplifier having two inputs that are connected to the two photodiodes, respectively;
  the level adjusting circuit; and
  two feedback resistors that are connected to outputs of the level adjusting circuit and the inputs of the differential amplifier, respectively,
wherein the level adjusting circuit comprises two emitter follower circuits or two source follower circuits that are connected to two outputs of the differential amplifier, respectively,
wherein the levels of the positive phase signal and the negative phase signal of the two feedback closed loops are adjusted through adjustment to currents flowing through the emitter follower circuits or the source follower circuits,
wherein the DC level correcting circuit, which is provided at the subsequent stage of the differential transimpedance amplifier, comprises a differential circuit, and
wherein the DC level difference between the positive phase signal and the negative phase signal that have been demodulated is corrected through adjustment to input voltages of differential transistors of the differential circuit.

5. A light receiving circuit according to claim 1,
wherein the differential transimpedance amplifier comprises:
  a differential amplifier having two inputs that are connected to the two photodiodes, respectively;
  two emitter follower circuits or two source follower circuits that are connected to two outputs of the differential amplifier, respectively;
  two feedback resistors that are connected between outputs of the emitter follower circuits or the source follower circuits, and the inputs of the differential amplifier, respectively; and
  the level adjusting circuit,
wherein the level adjusting circuit comprises a differential circuit,
wherein the differential circuit has two outputs connected to respective connection lines between the outputs of the differential amplifier and inputs of the emitter follower circuits or the source follower circuits, and
wherein the levels of the positive phase signal and the negative phase signal of the two feedback closed loops are adjusted through adjustment to input voltages of differential transistors of the differential circuit.

6. A light receiving circuit according to claim 5, further comprising capacitors provided to outputs of the differential transimpedance amplifier so that connection to a subsequent-stage output amplifier is established by AC coupling.

7. A light receiving circuit according to claim 1,
wherein the differential transimpedance amplifier comprises:
  a differential amplifier having two inputs that are connected to the two photodiodes, respectively;
  the level adjusting circuit; and
  two feedback resistors that are connected to outputs of the level adjusting circuit and the inputs of the differential amplifier, respectively,
wherein the level adjusting circuit comprises two emitter follower circuits or two source follower circuits that are connected to outputs of the differential amplifier, respectively, and
wherein the levels of the positive phase signal and the negative phase signal of the two feedback closed loops are adjusted through adjustment to currents flowing through the emitter follower circuits or the source follower circuits.

8. A light receiving circuit according to claim 7, further comprising capacitors provided to outputs of the differential transimpedance amplifier so that connection to a subsequent-stage output amplifier is established by AC coupling.

9. A light receiving circuit according to claim 1, further comprising capacitors provided to outputs of the differential transimpedance amplifier so that connection to a subsequent stage is established by AC coupling.

10. A signal processing method, comprising:
  amplifying levels of an input positive phase signal and an input negative phase signal;
  adjusting signal amplitude levels of the amplified positive phase signal and the amplified negative phase signal so that the positive phase signal and the negative phase signal are equal to each other in amplitude;
  feeding the positive phase signal and the negative phase signal that have the adjusted signal amplitude levels back to inputs; and
  outputting the positive phase signal and the negative phase signal that have been demodulated.

11. A signal processing method according to claim 10, further comprising:
  correcting DC levels of the demodulated positive phase signal and the demodulated negative phase signal; and
  outputting the demodulated positive phase signal and the demodulated negative phase signal that have the corrected DC levels.

12. A light receiving circuit, comprising:

a pair of photodiodes;

a differential amplifier having two inputs that are connected to the photodiodes;

a level adjusting circuit for adjusting levels of two output signals from the differential amplifier so that the two output signals are equal to each other in amplitude; and two feedback resistors for feeding the output signals that have the adjusted levels back to the differential amplifier.

13. A light receiving circuit according to claim 12, further comprising a DC level correcting circuit for correcting DC levels of the output signals that have the adjusted levels.

* * * * *